United States Patent
Zheng

(10) Patent No.: US 10,455,717 B2
(45) Date of Patent: Oct. 22, 2019

(54) IMPLEMENTATION METHOD FOR STACKED CONNECTION BETWEEN ISOLATED CIRCUIT COMPONENTS AND THE CIRCUIT THEREOF

(71) Applicant: SHENZHEN XILONG TOY COMPANY LIMITED, Shenzhen (CN)

(72) Inventor: Yipu Zheng, Shenzhen (CN)

(73) Assignee: SHENZHEN XILONG TOY COMPANY LIMITED, Shenzhen (CN)

( * ) Notice: Subject to any disclaimer, the term of this patent is extended or adjusted under 35 U.S.C. 154(b) by 0 days.

(21) Appl. No.: 15/860,103

(22) Filed: Jan. 2, 2018

(65) Prior Publication Data
US 2018/0124941 A1    May 3, 2018

Related U.S. Application Data

(63) Continuation-in-part of application No. 15/258,788, filed on Sep. 7, 2016, now Pat. No. 9,894,791.

(30) Foreign Application Priority Data

Apr. 25, 2016   (CN) .......................... 2016 1 0259246

(51) Int. Cl.
*H01L 23/482*    (2006.01)
*H05K 7/00*       (2006.01)
(Continued)

(52) U.S. Cl.
CPC ......... *H05K 7/005* (2013.01); *H01L 23/4824* (2013.01); *H01L 24/05* (2013.01); *H01L 24/06* (2013.01); *H01L 29/861* (2013.01); *H01L 25/16* (2013.01); *H01L 29/73* (2013.01); *H01L 2224/0556* (2013.01); *H01L 2224/05553* (2013.01); *H01L 2224/06183* (2013.01);
(Continued)

(58) Field of Classification Search
None
See application file for complete search history.

(56) References Cited

U.S. PATENT DOCUMENTS 2,805,311 A  *  9/1957  Fluegel .............. G05D 23/2453
                                                       219/483
6,320,255 B1 *  11/2001  Terrill ............... H01L 21/28562
                                                       257/686
(Continued)

*Primary Examiner* — Long Pham
(74) *Attorney, Agent, or Firm* — Anova Law Group, PLLC

(57) ABSTRACT

The present invention discloses a modularized circuit for isolated circuit, wherein the isolated circuit includes at least two circuit components connecting in parallel and/or series, the circuit components, according to a circuit connection configuration, weld corresponding pins of the components directly, forming an integrated module in accordance with a desired connection method of the circuit, and saving circuit boards and wires; the circuit components are designed as a parallelepiped, and a plurality of bonding pads are arranged on part of an area on a surface of the parallelepiped. Due to constructing a circuit unit by welding connections in a way of building blocks, welding directly between components in a 3D space, comparing to the circuits limited in a circuit board plane as a PCB, it owns a wider design space.

5 Claims, 9 Drawing Sheets

(51) Int. Cl.
*H01L 23/00* (2006.01)
*H01L 29/861* (2006.01)
H01L 25/16 (2006.01)
H01L 29/73 (2006.01)

(52) U.S. Cl.
CPC .............. *H01L 2224/8023* (2013.01); *H01L 2224/80222* (2013.01); *H01L 2924/19104* (2013.01)

(56) References Cited

U.S. PATENT DOCUMENTS

2009/0000154 A1   1/2009   Hartwick
2009/0001541 A1*   1/2009   Covert .................. H01L 25/105
                                                              257/686

* cited by examiner

IMPLEMENTATION METHOD FOR STACKED CONNECTION BETWEEN ISOLATED CIRCUIT COMPONENTS AND THE CIRCUIT THEREOF

CROSS-REFERENCES TO RELATED APPLICATIONS

This application is the continuation-in-part application of application Ser. No. 15/258,788, filed on Sep. 7, 2016, which claims the priority of Chinese patent application no. 201610259246.X, filed on Apr. 25, 2016, the entire contents of all of which are incorporated herein by reference.

FIELD OF THE INVENTION

The present invention relates to a circuit hardware implementation module and the circuit thereof, and, more particularly, to a brand new circuit implementation module and the circuit apparatus thereof.

BACKGROUND

For a circuit arrangement method in the prior art, except for an integrated circuit (IC) adopting a highly integrated circuit connection method, a plurality of conventional circuits and peripheral circuits around an IC chip are still adopting an isolated circuit, that is, a circuit is connected by adopting a plurality of isolated circuit components according to a circuit schematics, so as to achieve a function of the circuit.

A commonly used isolated circuit components mainly includes: a resister, a capacitor, a diode, a triode etc., wherein, a conventional circuit component is welded onto a printed circuit board (PCB), by adopting a method of welding pins; of course, a simple circuit may also be connected directly by wires, such as some circuits for experimental units.

Following a progress of a circuit processing art, specifically, in order to be convenient for an automatically welding and processing art, currently, the isolated circuit components are no longer adopting the method of welding pins, instead, a method of designing an electric component as a chip shape is adopted, including the resistor, the diode, the triode and more, specifically, by sharing a chip processing art of an IC chip, each chip component may be mounted onto the PCB through an automatic chip welding machine.

However, no matter either the above conventional pins welding art, or the chip components mounting art, generally, a component is welded onto a printed circuit board, that is, a PCB, usually, it is pre-designed before being pre-processed well in a PCB processing plant, in order to pre-print the majority of circuit wires onto a plate of insulation material, and circuits are printed on this insulation material following a pre-designed circuit configuration.

This kind of conventional circuit design method is subjected to a 2D printing art of the circuit board, the whole circuit is limited by sizes of the circuit board, while the circuit shall be distributed and formed on a circuit board plane; also, due to a requirement of using circuit boards, whose space size may not be designed flexibly, thus, a volume of the designed circuit board may not adapt to any small size products.

Therefore, the current technology needs to be improved and developed.

BRIEF SUMMARY OF THE DISCLOSURE

According to the above described defects, the purpose of the present invention is providing an implementation module for stacked connection between isolated circuit components and the circuit thereof, whose circuit implementation method may be considered in a 3D space, without any PCBs or wires, to achieve a simple but unrestricted free circuit and the implementation module thereof.

In order to achieve the above mentioned goals, the technical solution of the present invention to solve the technical problems is as follows:

A modularized circuit for isolated circuit, wherein the isolated circuit includes at least two circuit components connecting in parallel and/or series; the circuit components, in accordance with a circuit connection configuration, weld a plurality of corresponding pins of the components directly, making the components form an integrated module in accordance with a desired connection method of the circuit, and saving circuit boards and wires; the circuit component is designed in a parallelepiped, and a plurality of bonding pads are arranged on part of an area on a surface of the parallelepiped.

The modularized circuit, wherein the circuit components include a resister, a capacitor and/or an inductor, and bonding pads are arranged on at least two end faces of the resister/the capacitor/the inductor.

The modularized circuit, wherein the circuit components include a diode, and two bonding pads are arranged on a surface of the diode being able to distinguish different electric current directions The modularized circuit, wherein the circuit components further include a triode, three different bonding pad areas including a base electrode area, a collector area and an emitter area are designed on the triode.

An implementation module for stacked connection between isolated circuit components, whose setting is according to circuit components connecting in parallel/series in a circuit, wherein, in accordance with a circuit connection configuration, a plurality of corresponding pins of the components are welded directly, making the components form an integrated module in accordance with a desired connection method of the circuit, and saving a plurality of circuit boards and connection wires; the circuit component is designed in a parallelepiped, and a plurality of bonding pads are arranged on part of an area on a surface of the parallelepiped.

The implementation module for stacked connection between isolated circuit components, wherein the components comprise a resistor, and bonding pads are arranged on at least two end faces of the resistor.

The implementation module for stacked connection between isolated circuit components, wherein the resistor has a bonding pad arranged on at least one body side face.

The implementation module for stacked connection between isolated circuit components, wherein, the components further include a diode, the diode has two bonding pads arranged for distinguishing different current directions, the bonding pads are arranged on the side face and/or end face of the parallelepiped of the diode.

The implementation module for stacked connection between isolated circuit components, wherein the components further include a triode, on the parallelepiped of the triode, at least three different bonding pads for a base electrode, a collector and an emitter are arranged; the bonding pads for the base electrode and the emitter are arranged on either end face and one of the side face next to the end face respectively, while the bonding pad for the collector is arranged on a middle position around the parallelepiped.

The implementation module for stacked connection between isolated circuit components, wherein the parallelepiped has a ratio in length, width and height of 3:2:1 or 3:1:1.

The present invention provides an implementation module for stacked connection between isolated circuit components and the circuit thereof, due to adopting a plurality of modularized components, and a plurality of bonding pads arranged on the components convenient for welding, it is possible to construct a circuit unit by welding in a way of building blocks, so as to achieve a circuit easy to design and process, the circuit needs no presence of a PCB, instead, and forms a circuit unit of a isolated circuit simply by welding and splicing different components only, so as to form a circuit being able to save the circuit board space, and break a plane limit of a 2D circuit board, also, the design and implementation method is not limited to a circuit board welding and processing on a 2D plane, it may be achieved in a 3D space through directly welding between components, and comparing to the circuits limited in a circuit board plane as a PCB in the prior art, it owns a wider design space, also, it may shorten the time used for a circuit from design to build-up.

BRIEF DESCRIPTION OF THE DRAWINGS

FIG. 6 illustrates a schematic diagram on other equal implementations of the stacking method shown in FIG. 5a.

DETAILED DESCRIPTION OF EMBODIMENTS

The present invention provides an implementation method for stacked connection between isolated circuit components and the circuit thereof, in order to make the purpose, technical solution and the advantages of the present invention clearer and more explicit, further detailed descriptions of the present invention are stated here, referencing to the attached drawings and some preferred embodiments of the present invention. It should be understood that the detailed embodiments of the invention described here are used to explain the present invention only, instead of limiting the present invention.

The implementation method for stacked connection between isolated circuit components and the circuit thereof, as provided in the present invention, whose setting is point to at least two circuit components connecting in series or parallel in a circuit. Both the method and the circuit provided in the present invention need no circuit boards, instead, the circuit components are set in a regular shape, and interconnected in a docking or welding way, to achieve a stacked modular circuit, and from a view angle of stability of the circuit, connecting in welding is more preferred than that in docking. Due to adopting a stacked modular circuit structure, it may execute a free design in a 3D space according to a plurality of relatively simple circuits, so as to break a thinking way in the prior art for designing a circuit relying on a PCB, and requiring a 2D circuit design. Of course, for a relatively complicated circuit configuration, a mathematical topological structure principle is required for designing, and a core part of the relatively complicated circuit may adopt an IC design, and further design an IC chip in a modular way matching the modular circuit in the present invention, so as to facilitate welding and forming an operation circuit.

Each component in the circuit of the present invention may be stacked properly, following a plurality of connection configuration requirements of the schematic diagram of the circuit, and adopting a plurality of connection methods to generate an electric connection, including welding or docking a plurality of corresponding pins directly, making components form an integrated module and in a stacked way, in accordance with the connection method required by the circuit diagram, saving circuit boards and wires, it generates a design approach of a small and flexible volume, and forms a 3D circuit module according to a plurality of space requirements of the product circuit, therefore achieves a function of the circuit.

Figure 1:
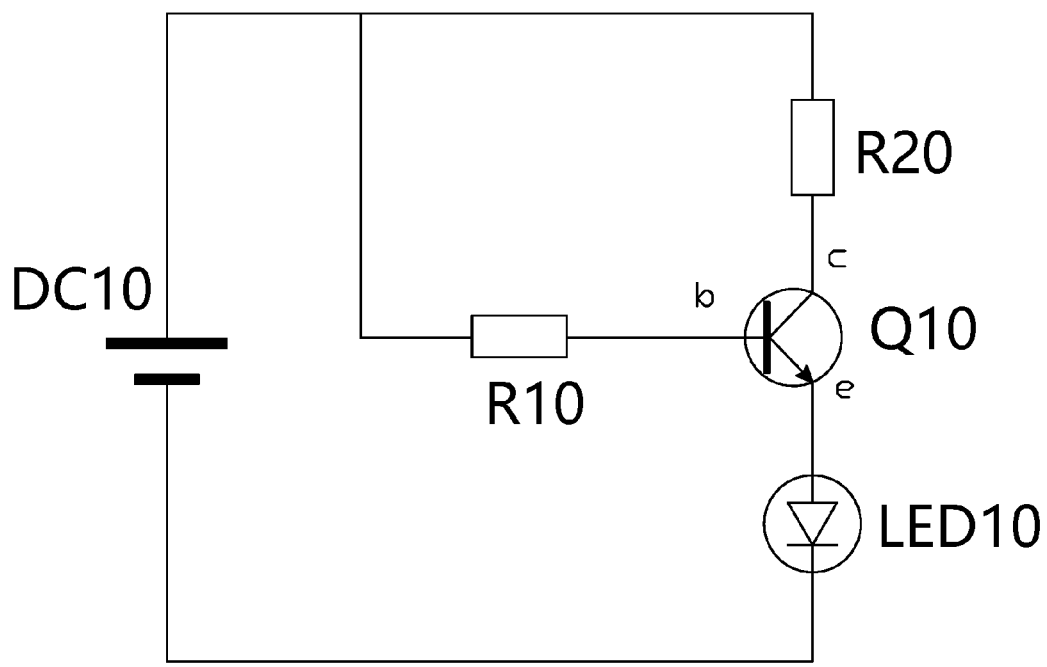
FIG. 1 illustrates a schematic diagram on the circuit of a first preferred embodiment of the present invention.
Figure 7:
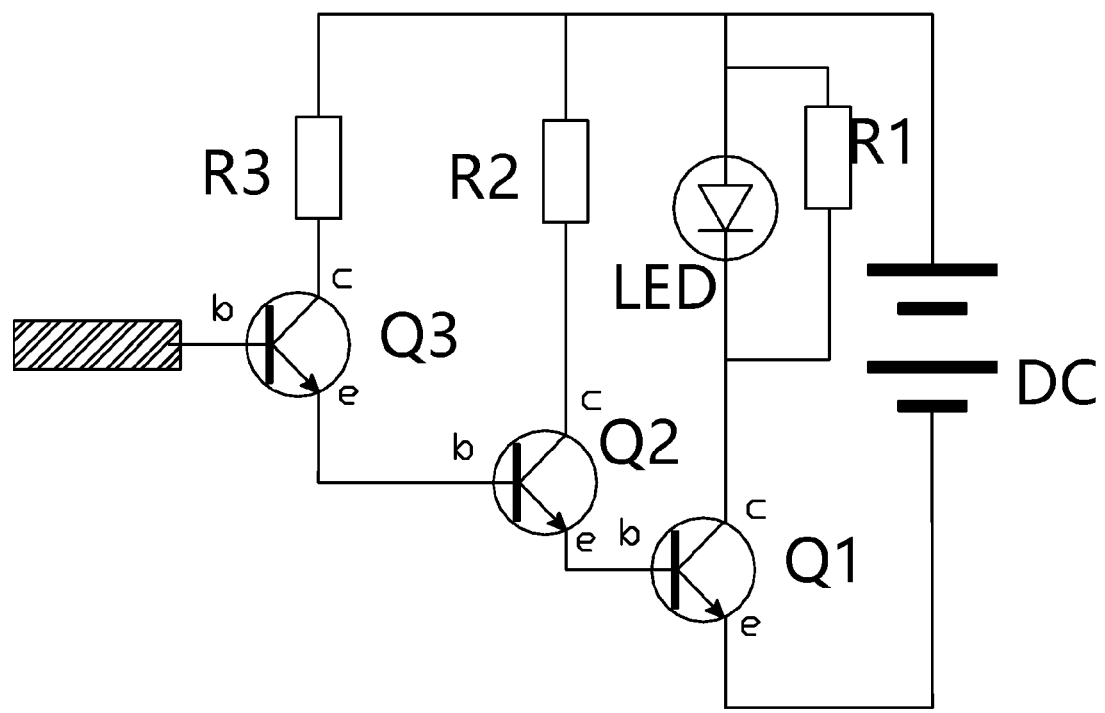
FIG. 7 illustrates a schematic diagram on the circuit of a second preferred embodiment of the present invention.

In the implementation method for stacked connection between each component as described in the present invention, and the circuit configuration thereof, the component includes a plurality of resistors R10, R20, as shown in FIG. 1, or resistors R1, R2, R3, as shown in FIG. 7, each resistor owns a similar configuration, except for the resistance value, the resistor is mainly designed as a parallelepiped, such as a cuboid, whose specific sizes may be designed according to any real requirements, or may be configured into different standard sizes in accordance with any electric features, such as heat dispersion requirements. For each resistor, at least one bonding pad 110 is arranged on each of both end faces. In such a way, resistors connected in series may be configured by welding connections extending from end to end.

Figure 3:
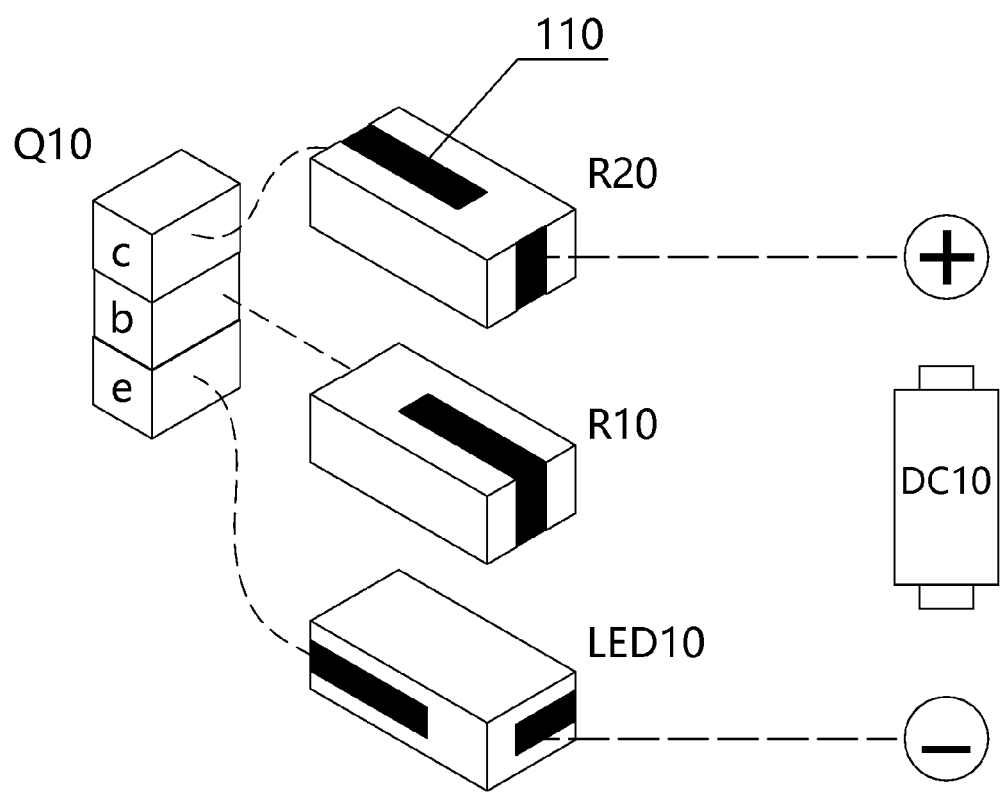
FIG. 3 illustrates a circuit module diagram of the present invention according to the schematic diagram of the circuit shown in FIG. 1.
Figure 4:
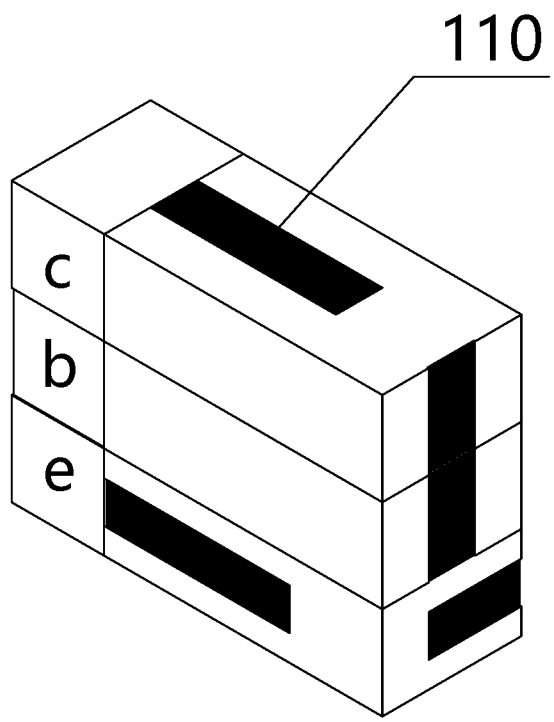
FIG. 4 illustrates a schematic diagram on a modular product of the circuit provided in the present invention, corresponding to the schematic diagram of the circuit shown in FIG. 3.

Preferably, the bonding pad on the resistor may be designed into an L shape, extending from an end face to a body face, that is, arranging a bonding pad on at least one body face electrically connecting to that arranged on the corresponding end face, and it may be configured that, a length of the bonding pad arranged on the body face exceeds half length of the side, as shown in FIG. 3 and FIG. 4.

Figure 5A:
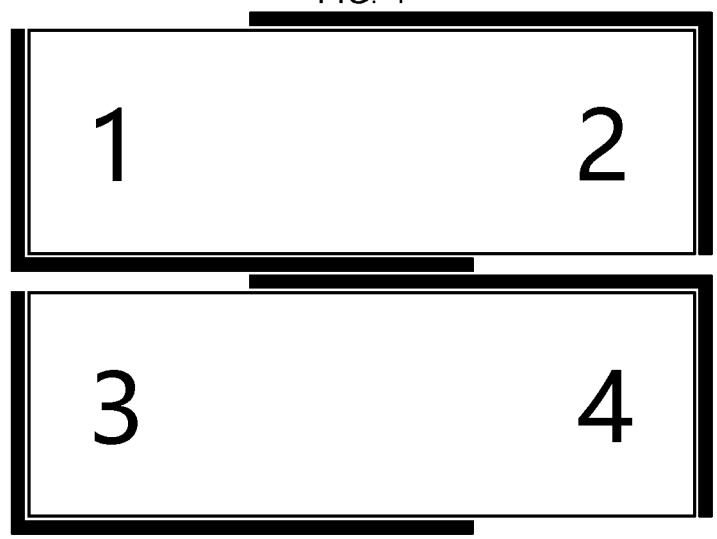
FIG. 5a illustrates a schematic diagram on a most basic circuit connection method in the present invention, that is, a welding connection diagram on a series connection.
Figure 5B:
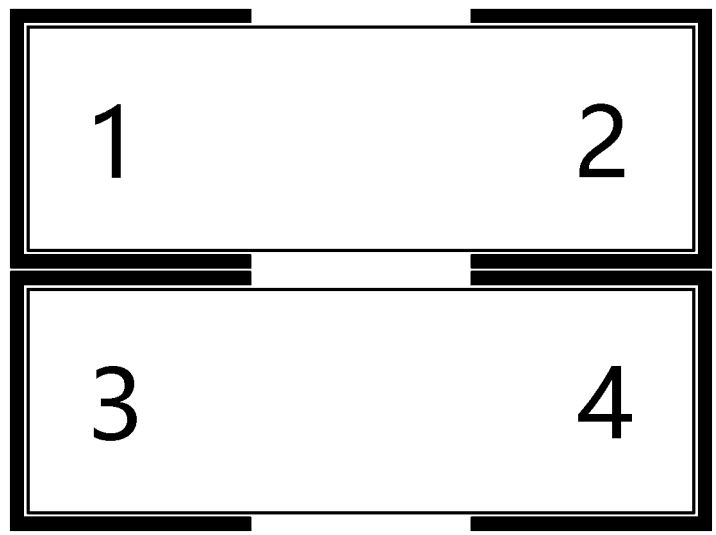
FIG. 5b illustrates a schematic diagram on a most basic circuit connection method in the present invention, that is, a welding connection diagram on a parallel connection.
Figure 5B:

A specific connection principle is shown in FIGS. 5a and 5b, as shown in FIG. 5a, the welding method for a series connection is welding overlapped bonding pads exceeding half length of the side of both components arranged in parallel, and it equals to a series connection of both resistors; as shown in FIG. 5b, when connecting in parallel, both bonding pads on both sides of the components may be arranged extending to side faces, so as to welding between bonding pads on both sides when both components are arranged in parallel, and forming a connection in parallel.

What are shown in both FIG. 5a and FIG. 5b are two basic unit connection methods, while all other circuit configurations in either parallel or series, may be achieved through combinations of the above two basic connection methods respectively, while for different connection methods, bonding pads on the components of the present invention, may be arranged according to different configuration feathers, for example, an L-shaped bonding pad structure shown in FIG. 5a is the one suitable for connection in series, while a square C-shaped bonding pad structure shown in FIG. 5b is the one suitable for connection in parallel. In the configurations arrangement of the bonding pads on the components of the present invention, it may arrange a plurality of different configuration standards to distinguish the connection method of the resistor, either in series or in parallel, as well as a plurality of configuration methods of other components, especially a polarity setting of a diode and more, while standards for these configurations need a further development.

Figure 2:
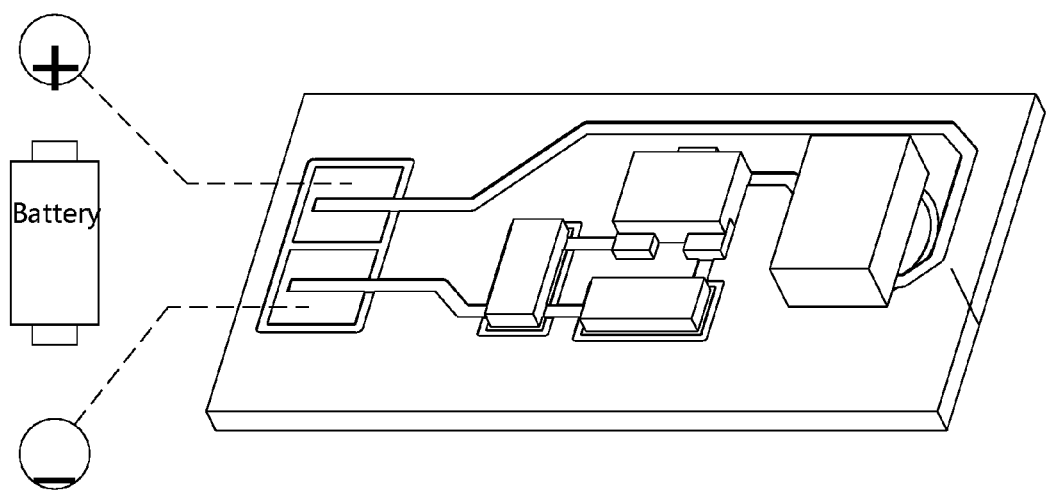
FIG. 2 illustrates a circuit board diagram on the prior art according to the schematic diagram of the circuit shown in FIG. 1.

What is shown in FIG. 2 is a circuit board diagram on the implementation method of the PCB circuit in the prior art, wherein, each component needs to be welded in patches or in jointing onto a reserved position on a pre-printed circuit board, and a formed product of the circuit is obviously different to that in the present invention, while the product in the present invention owns a modular configuration after being formed, and under a plurality of corresponding designed conditions, it may form a specific shape for docking, for example, in addition to a shape adapting to a space locating the circuit, it may also form different shapes in a space, including that of a person or an object.

In the implementation method for stacked connection between isolated circuit components and the circuit module thereof, the components further include components with polarized connection directions, such as a diode, as shown in FIG. 3 and FIG. 4, the diode may be designed as the same shape of the resistor, that is, a parallelepiped, preferably, arranging two bonding pads being able to distinguish different current directions for the connection direction of the diode, such as adding a labeled pattern or a plurality of raised dots on a positive electrode, and a more preferably design method is, arranging an unbalanced bonding pad, so as to ensure the polarization usage of the diode.

Figure 6:
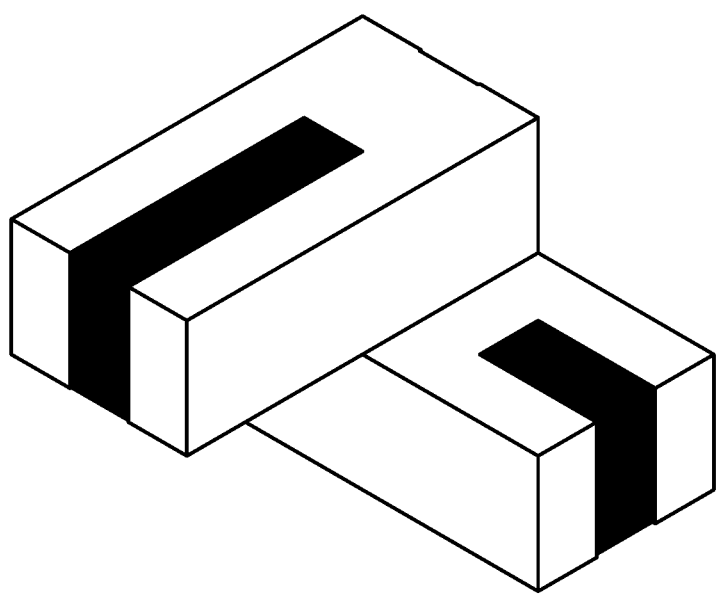
Figure 8:
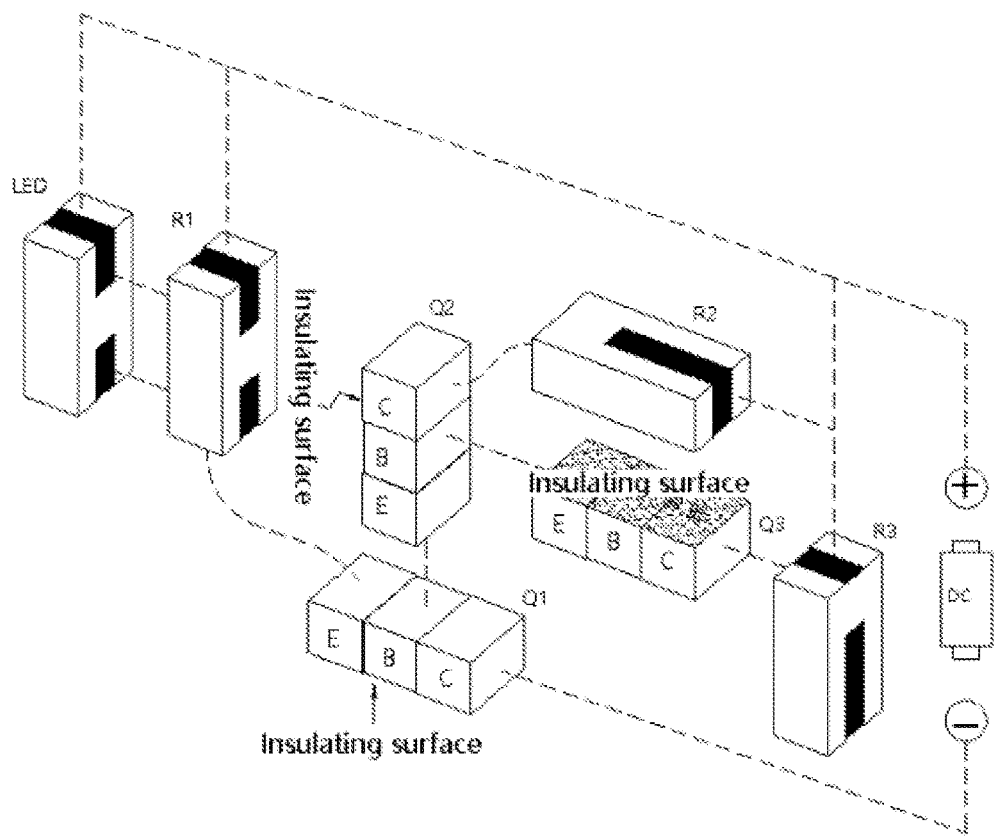
FIG. 8 illustrates a circuit modular diagram of the present invention according to the schematic diagram of the circuit shown in FIG. 7.
Figure 9:
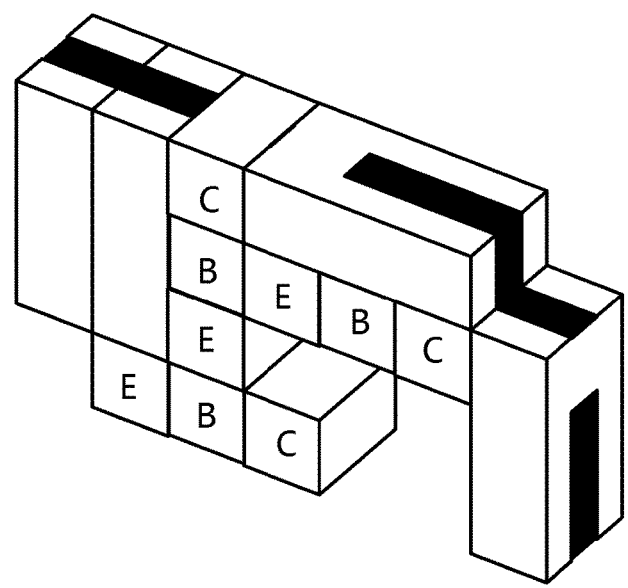
FIG. 9 illustrates a schematic diagram on the modular product of the circuit provided in the present invention corresponding to the schematic diagram on the circuit shown in FIG. 7.

The implementation method for stacked connection between isolated circuit components and the circuit thereof, the components further include components having more bonding pads, for example, a triode and an IC chip, the triode is also configured as a parallelepiped, and three different bonding pads are arranged onto the parallelepiped, including each for a base electrode, a collector and an emitter, for example, an amplifier and superposition circuit shown in FIG. 8 and FIG. 9, which may be applied to a sensor switch. The triode is arranged with three bonding pads of E, B, C, wherein, the module for the base electrode, that is, the B module, is arranged in a middle position (for different bonding configurations, the bonding pads for three electrodes may also be arranged in other configurations, for example, setting the B module for base electrode onto an end side), and one side face of the whole triode product is set as an insulating surface, while other corresponding faces are connected with other components including resistors or diodes, a modular product after specific connections is shown in FIG. 9, however, a specific topology structure of the product is not limited to the methods of combinations stated above, and the configuration for bonding pads of the circuit components is also not limited to that of each embodiment of the implementations. Shown as FIG. 6, it is also possible to adopt other stacked methods to achieve the connection in series shown as FIG. 5a. Since there is no limit from either face or frame of the circuit board, the possibility of realizing a circuit following the stacked method provided in the present invention is much higher than that of a conventional PCB method, and it owns a more flexible design space.

The modular circuit for an isolated circuit as provided in the present invention, wherein, the isolated circuit includes at least two circuit components connecting in series or in parallel; the circuit components, in accordance with the circuit connection configurations, wherein, the corresponding pins of the components are welded directly, making the components form an integrated module in accordance with a desired connection method of the circuit, saving circuit boards and wires. Wherein, the components including resistors, diodes, triodes and more, are all designed into a parallelepiped, while bonding pads are arranged for welding purposes. No matter for a relatively simple isolated circuit or a relatively complex one, through the modular welding configurations described above according to the present invention, it is possible to achieve a circuit module without any circuit boards or wires, so as to facilitate the realization of a circuit product in a small space, and the design is free in spaces, thus helps to produce a brand new circuit module.

The implementation module for stacked connections between isolated circuit components according to the present invention, is a specially designed modularized structure for realizing the circuit structure stated above, which aims mainly at a plurality of common circuit components, including the resistor, the capacitor, the diode, the triode and more, it adopts an external standardized modular structure, such as a parallelepiped, and may adopt a relatively uniform modularized size convenient for connection, facilitating to build the circuit up in a way of building blocks. Each of the circuit components, wherein the structure inside a body still adopts a specialized configuration method for each circuit, for example, a resistor is still a resistor itself, both diodes and triodes are still built by corresponding semiconductor silicon materials respectively, while only the shape adopts the parallelepiped convenient for stacking. A circuit design and manufacturing method according to the module and circuit provided in the present invention, may make a process and production faster, especially when it is applied to an automatic process and production line, since it needs no processes for wires or circuit boards, and it has a simpler process technology, thus a process and circle from design to production will be greatly shorten.

According to different numbers of pins of the circuit components, in the prior art, it adopts a pin method for production, while the circuit components according to the present invention adopt a method of arranging different bonding pad areas for circuit connections on the parallelepiped surfaces, and in order to facilitate forming the circuit in a way of stacking by building blocks, the sizes of parallelepipeds are configured uniformly. For example, the circuit component of a minimum basic unit adopts a size of the length, width and height according to the corresponding unit size, and a plurality of multiples may be applied between each other, so as to facilitate the size of the building-blocks matching a dimension of the circuit component. For example, the length is twice or triple of the width and the height, the width equals or doubles to the height, in such a way, when forming the circuit through fitting and stacking the bonding pad areas, it may be easy to form a neat collocation, and the formed circuit may be easier to form a more neat space-matched shape.

The components applied for isolated circuit according to the present invention, include not only resisters, capacitors (ceramic capacitors, electrolytic capacitors), diodes, triodes and more, the method also may be applied to realizing other components including inductors, CMOS tubes and more, it may even be applied to a packaging structure of an integrated circuit chip before forming a new type of circuit components with the structure of bonding pads three-dimensionally. For example, for an existing component having more than three pins, such as an integrated circuit chip, it is possible to configure the entire component to form a long column of the parallelepiped, whose length may be N times of the width, such as ten times or twenty times, and each unit size in the direction of the length, forms a plurality of sections of the bonding pad areas, facilitating to weld three-dimensionally with the bonding pad areas of other corresponding components. Without any wires or PCBs, a stacked and three-dimensional isolated circuit may still be achieved.

Figure 10A:
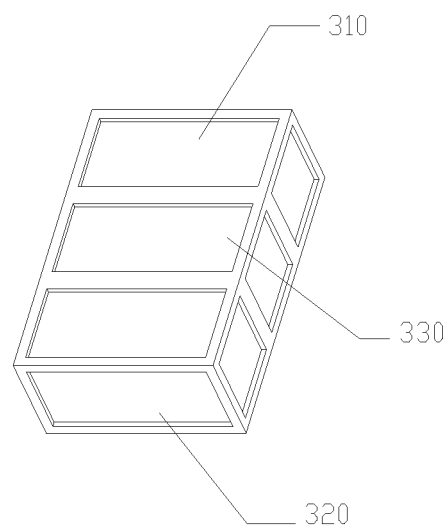
FIG. 10a, 10b illustrates a three-dimensional schematic diagram on the different parallelepipeds that may be adopted by a triode of the circuit component module in the present invention.
Figure 10B:
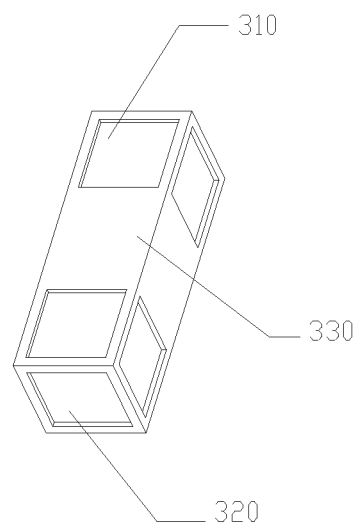

As shown in FIG. 10a, 10b, it is another implementation method of the circuit component module according to the present invention, such as a triode, when becoming a parallelepiped triode circuit component, may adopt two types of size configurations, one is a ratio of 3:2:1 in length, width and height, refer to FIG. 10a, another is a ratio of 3:1:1 in length, width and height, refer to FIG. 10b, of course, in a real implementation, a configuration is designed according to any real requirements, and is not limited to the two types listed above, but having more configurations of ratios and sizes. Such a multiplicative way to design different sizes of length, width and height has facilitated a formation of a relatively neat 3D construction for circuit modules when a real circuit is buildup in the way of building blocks. When the ratio of the length, width and height is adopting 3:2:1, it facilitates fitting two or three other circuit components connected in series or in parallel in a direction of either length or width. While adopting a cuboid with a ratio of 3:1:1 in length, width and height, it is possible to fit connecting three circuit components with other unit sizes in the direction of length, so as to form the circuit construction in a way of building blocks.

Figure 12A:
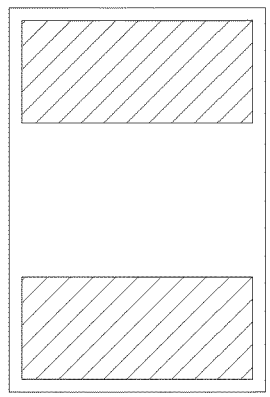
FIG. 12a, 12b, 12c illustrates respectively a schematic diagram on the bonding pad areas when building a stacked circuit and using a triode of the circuit component module in the present invention.
Figure 12B:
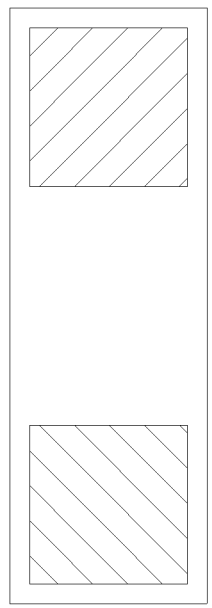
Figure 12C:
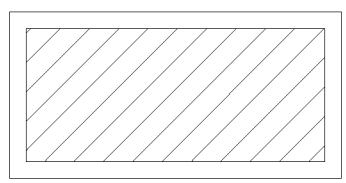

Due to a triode is a circuit component having three pins, that is, three electrodes of pins of E (emitter), B (base), and C (collector), thus, on an outer surface of the parallelepiped, it needs at least three types of bonding pad areas for circuit connections, a relatively convenient configuration method is, arranging an E electrode 310 and a C electrode 320 on two sides close to the end, that is, the end face or a side close to the end face, while on a middle position, a B electrode 330 is arranged. And, for facilitating matching and building the circuit in the building-block way, the bonding pad areas of different sides of a same electrode may not be totally used, for example, as the diode or triode shown in FIGS. 12a, 12b and 12c, when adopting a ratio of 3:2:1, the bonding pad areas on different sides may be selected for connecting a circuit in series or in parallel. In order to avoid any unnecessary electric conductions, for the bonding pad areas need no circuit connections, it may adopt a method of coating an insulation glue or not loading any conductive materials when manufacturing the circuit components.

Figure 10C:
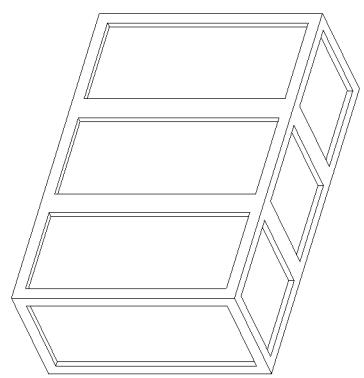
FIG. 10c, 10d illustrates a three-dimensional schematic diagram on the different parallelepipeds that may be adopted by a diode of the circuit component module in the present invention.
Figure 10D:
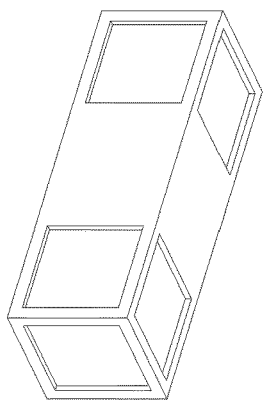
Figure 11A:
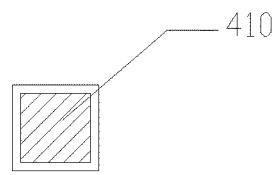
FIG. 11a, 11b illustrates respectively a schematic diagram on the bonding pad areas when building a stacked circuit and using a diode of the circuit component module in the present invention.
Figure 11B:
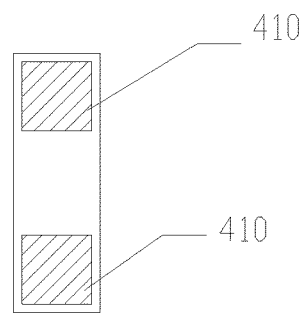

FIGS. 10c and 10d, illustrate schematic diagrams on the cuboids that may be adopted by a diode of the circuit component module in the present invention, whose configuration has a similar size ratio and shape as the FIGS. 10a and 10b. To distinguish a diode from a triode, different colors may be adopted, or printing some corresponding identification symbols and electrode symbols on the surfaces of the circuit components. To achieve an automatic process and assembly, it may also arrange a plurality of corresponding notch structures on the circuit component, in order to realize an identification between different components, which needs a further research and development. A bonding pad area 410 for the circuit component such as the diode or the triode, as shown in FIG. 11a or 11b, in a ratio of 3:1:1, according to requirements of connecting in series and in parallel, it may select a bonding pad area on the side face and/or the end face to achieve a corresponding circuit connection. During welding, a weld paste may be coated on the corresponding bonding pad areas, before heating and welding through a certain methods: for example, through an infrared welding or a high-frequency induction welding, or else, to form a solid welding; since the welding is finished by touching the corresponding bonding pad areas, an area for welding is relatively large, thus to the circuit, the welding is easier to achieve, without forming any fake welds. To those bonding pad areas needing no connections, if they are not touchable, they need no processes, or, they may be coated and isolated by an insulating paste, followed by a certain heating process, such as infrared, to form an insulating paste layer after curing, and only the bonding pad areas needed by the circuit connection are left. Through an electric connection between bonding pads of different components in a space, a circuit implementation structure without any wires or circuit board carriers is achieved.

In a further improvement, a concept of the circuit component modularization of the present invention may also be applied to more other integrated circuit chips and other components. These circuit components or assembly units with more than three pins, wherein the pins may be formed on a plurality of bonding pad areas on the outer surface of the parallelpiped of the chip component, so as to facilitate forming a three-dimensional circuit. An idea of the modular design for the circuit components as disclosed by the present invention may further be applied to a layout design for an integrated circuit, since it is adopting a design idea of a three-dimensional circuit, an idea of a circuit in space may be achieved through a computer and a space topology principle. Compared to a previous design idea of multi-layer plane Integrated Circuit layouts, the idea disclosed in the present invention has a higher freedom in a design space.

Compared with an SMT (Surface Mount Technology) in the prior art, the three-dimensional circuit of the present invention formed by the circuit components, may adopt a BMT (Block Mount Technology) or a DMP (Direct Mount Technology) technology, that is, in the future technology development, it needs to develop a design of the three-dimensional circuit units assembly and layout, saving the wires and the circuit boards, and welding and manufacturing the circuit directly.

It should be understood that, the application of the present invention is not limited to the above examples listed. Ordinary technical personnel in this field can improve or change the applications according to the above descriptions, all of these improvements and transforms should belong to the scope of protection in the appended claims of the present invention.

What is claimed is:

1. An implementation module for stacked connection between isolated circuit components, whose setting is according to circuit components connecting in parallel/series in a circuit, wherein, in accordance with a connection configuration of the circuit, a plurality of corresponding pins of the circuit components are welded directly, making the circuit components form an integrated module in accordance with a desired connection method of the circuit, and saving a plurality of circuit boards and connection wires; the circuit component is designed in a parallelepiped, and a plurality of bonding pads are arranged on part of an area on a surface of the parallelepiped;

wherein the parallelepiped has a ratio in length, width and height of 3:2:1 or 3:1:1.

2. The implementation module for stacked connection between isolated circuit components according to claim 1, wherein the circuit components include a resistor, and bonding pads are arranged on at least two end faces of the resistor.

3. The implementation module for stacked connection between isolated circuit components according to claim 2, wherein the resistor has a bonding pad arranged on at least one body side face.

4. The implementation module for stacked connection between isolated circuit components according to claim 1, wherein, the circuit components further include a diode, the diode has two bonding pads arranged for distinguishing different current directions, the bonding pads are arranged on the side face and/or end face of the parallelepiped of the diode.

5. The implementation module for stacked connection between isolated circuit components according to claim 1, wherein the circuit components further include a triode, on the parallelepiped of the triode, at least three different bonding pads for a base electrode, a collector and an emitter are arranged; the bonding pads for the base electrode and the emitter are arranged on either end face and one of the side face next to the end face accordingly respectively, while the bonding pad for the collector is arranged on a middle position around the parallelepiped.

* * * * *